(12) United States Patent
Li et al.

(10) Patent No.: US 8,760,626 B2
(45) Date of Patent: Jun. 24, 2014

(54) FOCUS DETECTION APPARATUS FOR PROJECTION LITHOGRAPHY SYSTEM

(75) Inventors: Jinlong Li, Sichuan (CN); Song Hu, Sichuan (CN); Lixin Zhao, Sichuan (CN); Feng Xu, Sichuan (CN); Lanlan Li, Sichuan (CN); Zhuang Sheng, Sichuan (CN)

(73) Assignees: The Institute of Optics and Electronics, Sichaun (CN); The Chinese Academy of Sciences, Sichuan (CN)

( * ) Notice: Subject to any disclaimer, the term of this patent is extended or adjusted under 35 U.S.C. 154(b) by 286 days.

(21) Appl. No.: 13/464,321

(22) Filed: May 4, 2012

(65) Prior Publication Data
US 2013/0027679 A1 Jan. 31, 2013

(30) Foreign Application Priority Data
Jul. 29, 2011 (CN) .......................... 2011 1 0216470

(51) Int. Cl.
G03B 27/52 (2006.01)
G03B 27/70 (2006.01)
G03F 9/00 (2006.01)

(52) U.S. Cl.
CPC .................................. *G03F 9/7026* (2013.01)
USPC ............................................. 355/55; 355/60

(58) Field of Classification Search
CPC .............................. G03F 9/7026; G03F 9/7061
USPC ................. 355/52, 55, 60, 67–71; 356/237.2, 356/399–401
See application file for complete search history.

(56) References Cited

U.S. PATENT DOCUMENTS

| | | | | |
|---|---|---|---|---|
| 4,677,301 A | * | 6/1987 | Tanimoto et al. | 250/548 |
| 5,502,311 A | * | 3/1996 | Imai et al. | 250/548 |
| 5,969,441 A | | 10/1999 | Loopstra et al. | |
| 2002/0054231 A1 | * | 5/2002 | Masuyuki | 348/362 |

* cited by examiner

*Primary Examiner* — Hung Henry Nguyen
(74) *Attorney, Agent, or Firm* — Knobbe, Martens, Olson & Bear, LLP

(57) ABSTRACT

Disclosed is a focus detection apparatus for a projection lithography system. The apparatus includes: a laser; a focus optical unit configured to focusing the emitted laser beam; a force detection unit configured to reflect the focused laser beam at the backside; a position detection unit configured to detect variations in position of a light spot formed by the reflected laser beam, and output a strength signal indicating the strength of the interaction force between the force detection unit and the object; a differential amplifier configured to output a Z-direction differential signal based on the strength signal and a reference signal; a Z-direction feedback control unit configured to perform feedback control; and a scan signal generator configured to output a signal for controlling the movement of the stage in the XY plane. The focus detection apparatus has high precision, efficiency and process applicability.

12 Claims, 2 Drawing Sheets

FOCUS DETECTION APPARATUS FOR PROJECTION LITHOGRAPHY SYSTEM

CROSS-REFERENCE TO RELATED APPLICATIONS

This application claims the benefit of Chinese Patent Application Number 201110216470 8 filed on Jul. 29, 2011, the disclosure of which is hereby expressly incorporated by reference in its entirety and hereby expressly made a portion of this application.

TECHNICAL FIELD

The present disclosure relates to apparatuses used in projection lithography, in particular to focus detection apparatuses in projection lithography systems in the field of Super Large-Scale Integration Circuit fabrication and nano-device fabrication in optical Micro-Fabrication technology.

BACKGROUND

It is well known that an increase in resolution of optical projection lithography is achieved primarily by shortening exposure wavelength and increasing numerical aperture. However, as the exposure wavelength is shortened and the numerical aperture is increased, effective depth of focus (DOF) for a projection object lens will decrease dramatically. Although some resolution-enhancing techniques, such as off-axis lamination and phase-shift mask, have been used to alleviate the decrease of DOF, the trend towards a decreased DOF still dominate with the increase of the resolution. The DOF is typically around only 300 nm in the mainstream 193 nm lithography. The fact that the actual DOF does not reach the DOF tolerance required by the lithography process will adversely affect exposure line quality and IC yield. Accordingly, it is very important to make full use of the effective DOF for efficient exposure of a wafer, and to this end, various focus detection apparatuses have been proposed. The focus detection apparatus in a projection lithography machine is configured to measure height and inclination of a certain surface region of the wafer. Then, the wafer is subjected to leveling and focusing such that the exposure region of the wafer surface is positioned within the effective DOF range of the projection object lens, thereby achieving an efficient exposure of the wafer.

The existing focus detection apparatuses are divided, in terms of operation principle, into three categories including capacitive, optical and pneumatic focus detection. The capacitive focus detection technique was mainly used for stepping-type projection lithography machines in earlier days. Now such technique is no longer in use due to some problems with accuracy, process applicability and the like. The optical focus detection technique dominates in the current stepping scan lithography machines provided by major manufactures. The optical focus detection technique includes luminosity, CCD, laser interference and grating focus detections. The luminosity focus detection technique is simple in principle and easy in implementation, but has a low precision in the range of several hundred nanometers and significant non-linearity. The CCD focus detection technique can achieve a repetitive test precision up to about 30 nm by using an array of slits or apertures in cooperation with broadband illumination, and is widely used. The laser interference focus detection technique can achieve a repetitive test precision of 20 nm. However, this technique requires complex graphic processing algorithms and is not good in real-time application, and thus has a limited use. The grating focus detection technique enables measurement over a large area of wafer surface by using various gratings as focus detection marks. This can effectively smooth the effects caused by undulation of the wafer topography and variation in emissivity. Meanwhile, utilization of polarization modulation and Moire technique extends dynamic measurement range of a sensor and reduces influence of light intensity fluctuation. The grating focus detection technique can achieve a high precision. However, the precision suffers from multi-beam interference caused by a layer of photoresist mask, wavefront distortion caused by substrate dielectric medium and the like. The pneumatic focus detection is operated in an aerodynamic ranging principle, and can achieve a sensitivity of sub-nanometer order. This technique, however, has some disadvantages, such as inapplicability in a vacuum environment, direct reading conversion in which no air gap can pass through the airflow sensor, and slow-speed scanning, which limits application of the technique.

SUMMARY

The present disclosure provides a focus detection apparatus for a projection lithography machine, comprising:
 a laser configured to emit a laser beam;
 a focus optical unit configured to focus the emitted laser beam;
 a force detection unit configured to receive the focused laser beam at the backside of the force detection unit and reflect the received laser beam;
 a position detection unit configured to detect variations in position of a light spot formed by the reflected laser beam so as to obtain information about the topography of the object, and to detect and output a strength signal indicating the strength of an interaction force between the force detection unit and an object under detection disposed on a wafer, the wafer being carried on a stage of the projection lithography machine;
 a differential amplifier configured to have one of its two input connected to the output of the position detection unit to receive the strength signal, and the other input connected to receive a reference signal, and to perform differential calculation between the strength signal and the reference signal to obtain and output a Z-direction differential signal;
 a Z-direction feedback control unit configured to perform feedback control such that a spacing between the force detection unit and the object is maintained within a specified range, wherein the Z-direction feedback control unit has one of its two inputs connected to the output of the differential amplifier to receive the Z-direction differential signal, and the other input connected to receive a predetermined gain signal, and the Z-direction feedback control unit outputs a Z scan drive signal for controlling the movement of the stage in the Z direction; and
 a scan signal generator configured to connect to the stage and output to the stage a XY 2D scan drive signal for controlling the movement of the stage in the XY plane, the Z direction being perpendicular to the XY plane.

The apparatus according to embodiments of the present disclosure has advantages of high precision, efficiency and process applicability. In the apparatus, the weak interaction force between atoms of the photoresist coated over the wafer surface and atoms of the probe tip of the force detection unit can cause deflection of the force detection unit. The position detection unit can detect such deflection to obtain information about the distribution of the interaction force. That is, the 3D topography information of the photoresist over the wafer surface can be obtained with a resolution of the nanometer order by detecting the interaction force between the probe tip and the photoresist. In this way, it is possible to solve the low-resolution problem with the convention optical focus detection approach and provide data basis for subsequent wafer leveling and focusing action. Further, in the apparatus, a plurality of force detection units can be used simultaneously for scanning and measurement. This addresses the low-efficiency problem with the single-spot measurement of the pneumatic focus detection, and improves the operating efficiency. In addition, the apparatus according to embodiments of the present disclosure performs topography measurement by detecting the inter-atomic force, and thus the measurement is not influenced by process conditions, such as photoresist type, property, reflectivity, thickness and substrate dielectric medium. Accordingly, the apparatus can be applied to various process conditions. In the apparatus according to embodiments of the present disclosure, a coarse/fine movement driving unit composed of a linear motor and a Lorentz motor can be employed, which enables a large travel and high precision movement of a six-freedom stage. This solves some problems with the atomic force microscope, such as narrow scanning range and deviation of leveling reference. The apparatus according to embodiments of the present disclosure is suitable for surface topography measurement of wafers having a diameter equal to or larger than 300 mm.

BRIEF DESCRIPTION OF THE DRAWINGS

The above features and advantages of the present disclosure will be more apparent from the following detailed description in conjunction with accompanying drawings in which.

DETAILED DESCRIPTION OF THE PREFERRED EMBODIMENTS

Hereafter, the present disclosure will be described by embodiments with reference to figures. Any parameter given in the embodiments should be construed for illustrating the present disclosure. One skilled in the art will appreciate that the present disclosure is not limited to the specific elements in the given embodiments. Rather, the present disclosure is defined by the appended claims.

Figure 1:
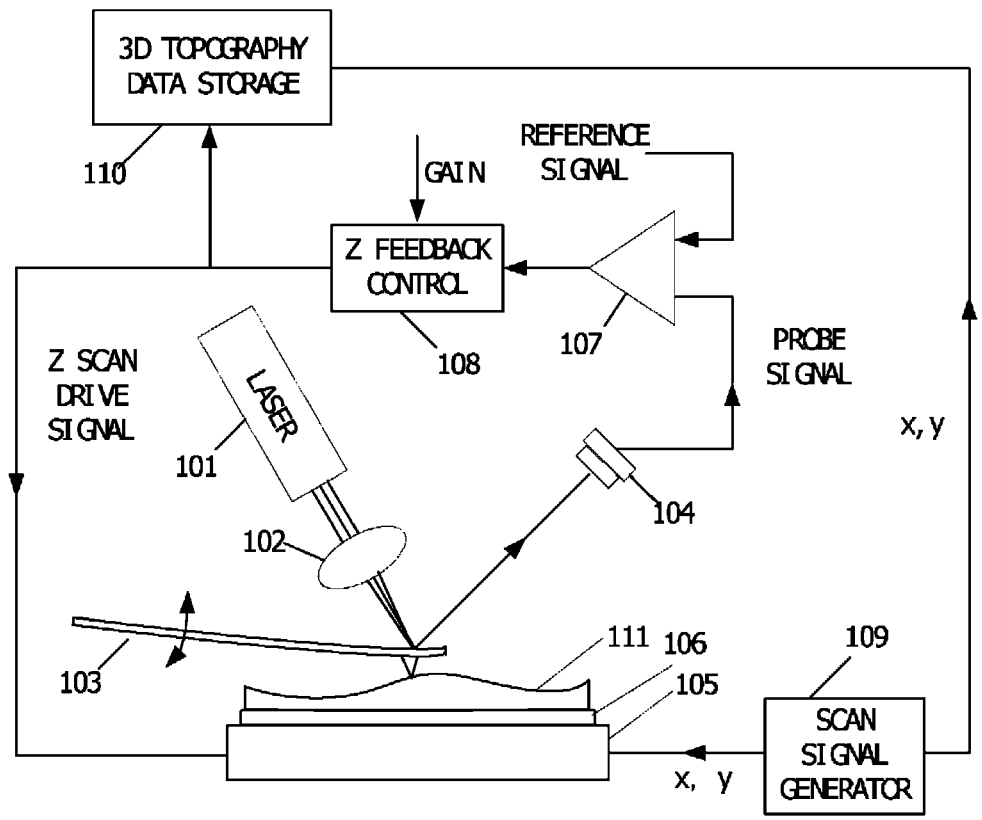
FIG. 1 is a schematic diagram showing a focus detection apparatus having a single probe according to an embodiment of the present disclosure.

FIG. 1 is a schematic diagram showing a focus detection apparatus having a single probe according to an embodiment of the present disclosure. The focus detection apparatus may include a laser 101, a focus optical unit 102, a force detection unit 103, a position detection unit 104, a differential amplifier 107, a Z-direction feedback control unit 108, a scan signal generator 109 and a 3D topography data storage unit 110.

In some embodiments, the focus optical unit 102 may be provided between the laser 101 and the force detection unit 103. The position detection unit 104 may be provided in a path along which light is reflected from the force detection unit 103. A laser beam emitted by the laser 101 may be focused by the focus optical unit 102 onto the backside of the force detection unit 103, and then reflected to the position detection unit 104. The force detection unit 103 may have a probe which has a spacing of nanometer order from a photoresist 111 disposed on a wafer 106, which may be carried on a six-freedom stage 105.

A signal may be generated with atomic interaction force between the probe and the photoresist 111 to indicate the strength of the interaction force. The wafer 106 may be vacuum-absorbed onto the stage 105. The atomic interaction force between the probe tip and the photoresist 111 causes deflection of the force detection unit 103 in accordance with the topography of the photoresist 111. Along with the deflection, the reflected beam is deflected, and the position detection unit 104 may detect change in the position of a light spot. This enables the position detection unit 104 to obtain the topography information of the photoresist 111. The 6-freedom stage 105 may be driven by a coarse/fine movement driving unit (not shown) consisting of a linear motor and a Lorentz motor (for more details, reference may be made to patent document U.S. Pat. No. 5,969,441), and thus can achieve a large travel and high precision movement.

The stage 105 may be connected to the driving output of the scan signal generator 109. During a XY 2D scanning process, the wafer 106 may be moved along with the movement of the stage 105 driven by a driving signal from the scan signal generator 109. The position detection unit 104 may detect and output a probe signal indicating the strength of the interaction force between the probe and the photoresist 111. The Z-direction feedback control unit 108 may calculate the spacing between the probe and the photoresist 111, and accordingly change a Z-direction driving voltage for driving the stage along the Z direction. The differential amplifier 107 may have one of its inputs connected to the output of the position detection unit 104. In this way, the differential amplifier 107 may receive the probe signal, perform a differential calculation between the probe signal and a reference signal, and output a Z-direction differential signal to be used for moving the stage 105. The Z-direction feedback control unit 108 may have one of its input connected to the output of the differential amplifier 107 to receive the Z-direction differential signal. The Z-direction feedback control unit 108 may also receive a predetermined gain signal and output a Z scan driving signal. The output of the Z-direction feedback control unit 108 may be connected to the 3D profilometry data storage unit 110 and the Z scan voltage input of the stage 105. Under the Z scan voltage, a Z-direction leveling and focusing mechanism (not shown) provided for the stage 105 moves and thus brings the photoresist 111 to rise or fall. In this way, the spacing between the probe and the photoresist 111 may be adjusted and always maintained in the nanometer order. This may achieve feedback control by the Z-direction feedback control unit 108 and facilitate the 3D topography measurement of the photoresist 111 disposed on the wafer 106. The 3D topography data storage unit 110 may also be connected to the scan signal generator 109 to receive the output (x, y) coordinates, and to the Z-direction feedback control unit 108 to receive the outputted z coordinate. Then the storage unit 110 may store the (x, y, z) coordinates as the 3D topography data for the photoresist 111. Since multiple exposure fields (DIE) on the wafer 106 are subjected to a series of processes, like exposure, development, etching, etc., in exactly the same process condition, the topography and structure of these exposure fields are also uniform. Accordingly, it is possible to improve the efficiency with an operating mode in which scanning and measurement of the multiple exposure fields may be simultaneously performed by using multiple respective micro suspension arms.

The force detection unit 103 may include a micro suspension arm 201. The micro suspension arm 201 may be form by a silicon or silicon nitride wafer typically having a length of 100-500 µm and a thickness of 500 nm-500 µm. The micro suspension arm 201 may have a probe provided at one of its ends. The probe may have a sharp tip which may be used to detect the atomic interaction force between the probe and the photoresist 111. The position detection unit 104 may include a position-sensitive photoelectric detector 203 which may be a quadrant detector or a CCD image sensor. The 6-freedom precision stage 105 may be provided with a Z-direction leveling and focusing mechanism (not shown) which may be composed of three piezoelectric ceramics arranged in equilateral. The 3D topography data storage unit 110 may associate the (x, y) coordinates obtained by the scan signal generator with the z coordinate obtained by the Z-direction feedback control unit 108 and store them as 3D topography data (x, y, z).

In operation, a laser beam emitted by the laser 101 is focused by the focus optical unit 102 onto the backside of the micro suspension arm 201, and then reflected from the backside to the position-sensitive photoelectric detector 203. During the XY 2D scanning process, the wafer 106 is moved along with the movement of the stage 105, and the micro suspension arm 201 is deflected in accordance with the topography of the photoresist 111 due to the interaction force between the atoms of the photoresist 111 surface and the probe tip of the micro suspension arm 201. The reflected beam is deviated with the deflection of the micro suspension arm 201. As a result, the detection result of the position-sensitive photoelectric detector 203 varies. The topography information of the photoresist 111 can be obtained by detecting variations in the detection result. Such obtained measurement may have a precision of sub-nanometer order. Meanwhile, the detection result from the position-sensitive photoelectric detector 203 may be differentiated with a reference signal and amplified, and the amplified result may be inputted to the Z-direction feedback control unit 108. The Z-direction feedback control unit 108 may in turn adjust the Z-directional height of the 6-freedom stage 105, such that the photoresist 111 may be lifted or lowered to maintain the spacing between the probe and the photoresist 111. For example, the spacing may be maintained in a specified range, such as 1~100 nanometers.

Figure 2:
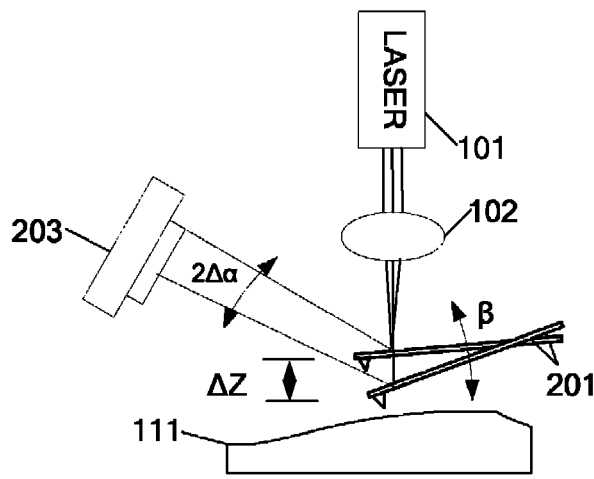
FIG. 2 is a schematic diagram showing in principle micro displacement detection with a light spot deflection method according to an embodiment of the present disclosure.

FIG. 2 shows in principle micro displacement detection with a light spot deflection method according to an embodiment of the present disclosure. A laser beam emitted by the laser 101 is focused by the focus optical unit onto the backside of the micro suspension arm 201, and then reflected from the backside to the position-sensitive photoelectric detector 203. The micro suspension arm 201 is deflected with, for example, the fluctuation of the topography of the photoresist 111, leading to a deflection angle $\Delta\alpha$. The reflected beam is thus deflected by an angle of $2\Delta\alpha$ on the position-sensitive photoelectric detector 203. The resulting displacement may be detected using the following equations:

$$\begin{cases} \Delta s = (L - \Delta z \cos(2\beta)) \times \sin(2\Delta\alpha) + \Delta z \times \sin(2\beta) & (1) \\ \Delta s \approx L \times 2\Delta\alpha = L \times 2 \times \frac{\Delta z}{l} = \frac{2L}{l} \times \Delta z & (2) \end{cases}$$

wherein $\Delta s$ denotes the displacement of a detected light spot, L denotes the optical path of the reflected light, $\Delta z$ denotes the deviation of the probe, $\beta$ denotes the initial position angle of the probe, $\Delta\alpha$ denotes the deflection angle of the micro suspension arm 201, and l denotes the length of the micro suspension arm 201. The relation between the probe deviation $\Delta z$ and the photoelectric detector output may be derived in connection with the following equations (3) and (4):

$$\begin{cases} X = \frac{k(I_A + I_C - I_B - I_D)}{I_A + I_B + I_C + I_D} \\ Y = \frac{k(I_A + I_B - I_C - I_D)}{I_A + I_B + I_C + I_D} \end{cases} \quad (3)$$

$$\Delta s = \sqrt{X^2 + Y^2} \quad (4)$$

wherein $I_A, I_B, I_C, I_D$ denotes four current outputs from the photoelectric detector 203, X, Y denotes the detected x- and y-direction displacement of a light spot on the photoelectric detector 203, respectively, and k is a correction factor.

Figure 3:
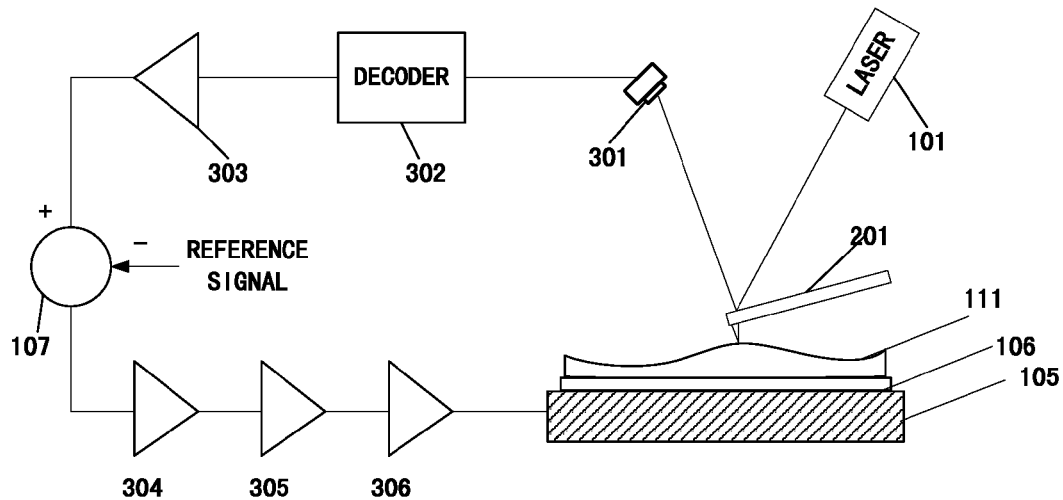
FIG. 3 is a simplified diagram showing a Z-direction feedback control unit in the focus detection apparatus having a single probe according to an embodiment of the present disclosure.

FIG. 3 is a simplified diagram showing the control configuration of the Z-direction feedback control unit 108 of FIG. 1. The feedback control unit 108 may include a forward amplifier 303, a decoder 302, a scaling unit 304, an integration unit 305 and a voltage amplification unit 306.

The Z-direction feedback control unit 108 may use a digital feedback control loop. The input and output of the decoder 302 may be connected with the input of the forward amplifier 303 and the output of the position-sensitive photoelectric detector 301, respectively. A current signal outputted from the position-sensitive photoelectric detector 301 may be decoded by the decoder 302 and then amplified by the forward amplifier 303, which may have its output connected with one of the inputs of the differential amplifier 107. The differential amplifier 107 may receive the amplified current signal and a reference signal and output a differential signal. The output of the differential amplifier may be connected to the scaling unit 304 which is connected in series with the integration unit 305 and the voltage amplification unit 306.

In some embodiments, the differential signal may be scaled by the scaling unit 304 with a factor Kp, adjusted by the integration unit 305 with an integration time factor Ki, and then adjusted by the voltage amplification unit 306 with an amplification coefficient K. As such, the feedback loop may control to drive the Z-direction leveling and focusing mechanism of the stage 105 such that the spacing between the probe and the photoresist 111 is maintained. More specifically, during the scanning process where the wafer 106 is moved along with the movement of the stage 105, the strength of the interaction force between the probe and the photoresist 111 may be derived from the output of the position-sensitive photoelectric detector 301. Accordingly, the Z-direction height information may be obtained for the photoresist 111 surface, and such information may be used to change the Z-direction driving voltage for moving the stage 105. In this way, the spacing between the probe and the photoresist 111 may be adjusted by the Z-direction leveling and focusing mechanism formed of piezoelectric ceramics (PZT) and maintained in the nanometer order. This achieves the desired feedback control.

To increase the yield in the industry, a wafer having a diameter of about 300 mm is commonly used. Currently preparation for using a wafer of an about 400 mm diameter is undergoing. Such large-area wafer typically includes a plurality of exposure fields. These exposure fields (DIE) on the wafer are subjected to a series of processes, like exposure, development, etching, etc., in exactly the same process condition, and thus the topography and structure of these exposure fields are also uniform. Accordingly, it is possible to improve the efficiency with an operating mode in which scanning and measurement of the multiple exposure fields may be simultaneously performed by using multiple respective micro suspension arms.

Figure 4:
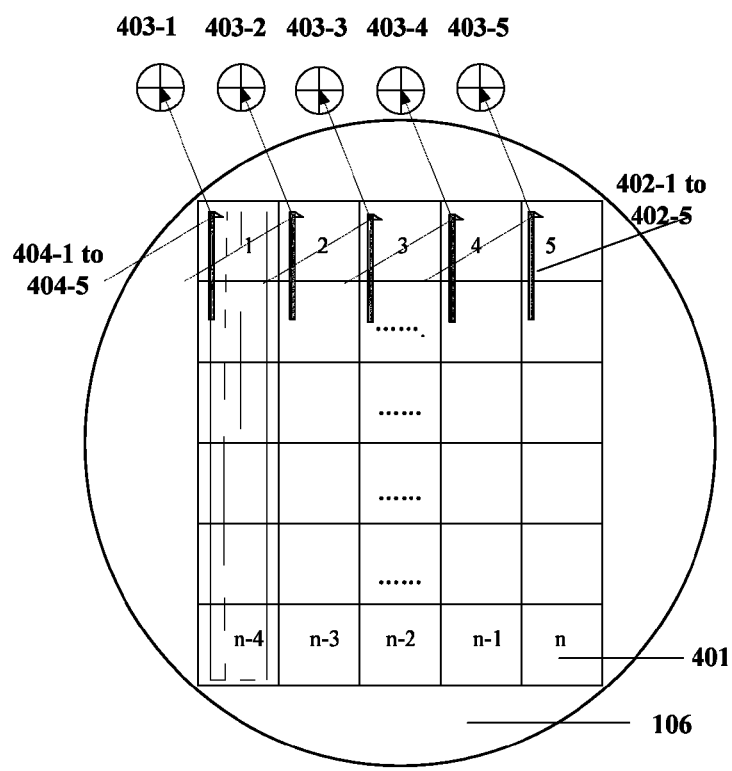
FIG. 4 is a schematic diagram showing the scanning operation of a focus detection apparatus having multiple probes according to an embodiment of the present disclosure.

FIG. 4 is a schematic diagram showing the scanning operation of a focus detection apparatus having multiple probes according to an embodiment of the present disclosure. As shown in FIG. 4, first to fifth position-sensitive photoelectric detectors 403-1 to 403-5, first to fifth micro suspension arms 402-1 to 402-5, and first to fifth laser beams 404-1 to 404-5. The numbers 1, 2, . . . , n denote how many exposure fields 401 are provided in the wafer 106. The number of the micro suspension arms 402-1 to 402-5 may be the same as the number of columns of the exposure fields 401, and they may be fixedly connected at the same height. The first to fifth laser beams 404-1 to 404-5 may be incident onto the backsides of the first to fifth micro suspension arms 402-1 to 402-5 respectively, and reflected to the first to fifth position-sensitive photoelectric detectors 403-1 to 403-5 respectively. The wafer 106 may be moved with the movement of the stage along the thin solid line in FIG. 4 during the XY 2D scanning process. The multiple probes of the micro suspension arms 402-1 to 402-5 may operate simultaneously to efficiently measure the 3D topography of the photoresist over the wafer 106. The measurements may be provided as data basis for leveling and focusing action in subsequent exposure process.

The foregoing description is only made to the embodiments of the present disclosure, and the present disclosure is not limited thereto. It should be noted to those ordinarily skilled in the art that various modifications and refinements can be made within the principle of the present disclosure and should be encompassed by the scope of the present disclosure.

What is claimed is:

1. A focus detection apparatus for a projection lithography machine, comprising:
   a laser configured to emit a laser beam;
   a focus optical unit configured to focus the emitted laser beam;
   a force detection unit configured to receive the focused laser beam at the backside of the force detection unit and reflect the received laser beam;
   a position detection unit configured to detect variations in position of a light spot formed by the reflected laser beam so as to obtain information about the topography of an object, and to detect and output a strength signal indicating the strength of an interaction force between the force detection unit and the object under detection disposed on a wafer, the wafer being carried on a stage of the projection lithography machine;
   a differential amplifier configured to have one of its two input connected to the output of the position detection unit to receive the strength signal, and the other input connected to receive a reference signal, and to perform differential calculation between the strength signal and the reference signal to obtain and output a Z-direction differential signal;
   a Z-direction feedback control unit configured to perform feedback control such that a spacing between the force detection unit and the object is maintained within a specified range, wherein the Z-direction feedback control unit has one of its two inputs connected to the output of the differential amplifier to receive the Z-direction differential signal, and the other input connected to receive a predetermined gain signal, and the Z-direction feedback control unit outputs a Z scan drive signal for controlling the movement of the stage in the Z direction; and
   a scan signal generator configured to connect to the stage and output to the stage a XY 2D scan drive signal for controlling the movement of the stage in the XY plane, the Z direction being perpendicular to the XY plane.

2. The focus detection apparatus of claim 1, wherein while the stage is driven to move in the XY plane and the object is moved along with the movement of the stage, the interaction force causes the force detection unit to be deflected in accordance with the topography of the object, and the laser beam reflected by the force detection unit is deflected by the deflection,
   the position detection unit detects a change in position of the light spot caused by the laser beam deflection to obtain the information about the topography of the object.

3. The focus detection apparatus of claim 1, wherein the Z-direction feedback control unit is further configured to change the Z scan drive signal based on the received Z-direction differential signal so as to control the movement of the stage and the object in the Z direction, such that the spacing between the force detection unit and the object is maintained within the specified range.

4. The focus detection apparatus of claim 1, wherein the specified range is a range of 1~100 nanometers,
   the force detection unit is configured to have a probe, and the interaction force comprises inter-atomic force between atoms of the tip of the probe and atoms of the object.

5. The focus detection apparatus of claim 1, wherein the object under detection comprises a photoresist disposed on the wafer, and the wafer is vacuum-absorbed onto the stage.

6. The focus detection apparatus of claim 1, wherein the stage is configured to include a Z-direction leveling and focusing mechanism which moves the stage and the object in the Z direction under the control of the Z scan drive signal.

7. The focus detection apparatus of claim 1, further comprising:
   a 3D topography data storage unit configured to connect to the scan signal generator and the Z-direction feedback control unit to receive (x, y) coordinate data from the scan signal generator and z coordinate data from the Z-direction feedback control unit, and store the received data as 3D topography data (x, y, z) for the object.

8. The focus detection apparatus of claim 1, wherein the force detection unit comprises a micro suspension arm made from a silicon or silicon nitride wafer having a length of 100-500 μm and a thickness of 500 nm-5 μm.

9. The focus detection apparatus of claim 8, wherein the micro suspension arm has a probe at its end part,
   the probe is configured to have a sharp tip for detecting the inter-atomic force between atoms of the tip of the probe and atoms of the object.

10. The focus detection apparatus of claim 1, wherein the position detection unit comprises a position-sensitive photoelectric detector,
    the position-sensitive photoelectric detector comprises a quadrant detector or a CCD image sensor.

11. The focus detection apparatus of claim 6, wherein the Z-direction leveling and focusing mechanism comprises three piezoelectric ceramics arranged in an equilateral shape.

12. The focus detection apparatus of claim 1, wherein the stage comprises a six-freedom stage which is driven by a coarse/fine movement driving unit consisting of a linear motor and a Lorenz motor.

* * * * *